(12) United States Patent
Onohara

(10) Patent No.: US 11,641,211 B2
(45) Date of Patent: May 2, 2023

(54) RECEIVER DEVICE AND RECEPTION METHOD

(71) Applicant: MITSUBISHI ELECTRIC CORPORATION, Tokyo (JP)

(72) Inventor: Kiyoshi Onohara, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 118 days.

(21) Appl. No.: 17/387,467

(22) Filed: Jul. 28, 2021

(65) Prior Publication Data

US 2021/0359697 A1    Nov. 18, 2021

Related U.S. Application Data

(63) Continuation of application No. PCT/JP2019/008422, filed on Mar. 4, 2019.

(51) Int. Cl.
*H03M 1/12* (2006.01)
*H04B 1/16* (2006.01)

(52) U.S. Cl.
CPC ......... *H03M 1/1245* (2013.01); *H03M 1/121* (2013.01); *H04B 1/16* (2013.01)

(58) Field of Classification Search
CPC ............................ H03M 1/1245; H03M 1/121
USPC .................................................. 341/155, 159
See application file for complete search history.

(56) References Cited

U.S. PATENT DOCUMENTS

| | | | |
|---|---|---|---|
| 5,250,948 A | 10/1993 | Berstein et al. | |
| 6,100,832 A | 8/2000 | Uesugi | |
| 6,452,518 B1 | 9/2002 | Kawabata | |
| 2005/0068211 A1 | 3/2005 | Arai et al. | |
| 2012/0242520 A1 | 9/2012 | Noguchi et al. | |
| 2013/0102264 A1 | 4/2013 | Nakane et al. | |
| 2013/0112992 A1* | 5/2013 | Kurtz ...................... G01L 9/065 | |
| | | | 257/77 |

(Continued)

FOREIGN PATENT DOCUMENTS

JP     2009-290885 A    12/2009
JP        4681622 B2     5/2011
(Continued)

OTHER PUBLICATIONS

Extended European Search Report dated Jan. 18, 2022 in counterpart European Application No. 19 91 8015.

(Continued)

*Primary Examiner* — Peguy Jean Pierre
(74) *Attorney, Agent, or Firm* — Birch, Stewart, Kolasch & Birch, LLP

(57) ABSTRACT

Provided is a receiver device including a first A/D converter (203), a second A/D converter (204), an amplifier (205) which is provided at a previous stage of the second A/D converter (204), and a digital signal processing unit (207). The digital signal processing unit (207) includes an amplitude comparison unit (211) configured to compare an amplitude of a digital signal output from the first A/D converter (203) and an amplitude of a digital signal output from the second A/D converter (204) to make a determination, and to output a determination result, and a selector (212) configured to select one of the digital signal output from the first A/D converter (203) or the digital signal output from the second A/D converter (204) based on the determination result.

13 Claims, 7 Drawing Sheets

(56) References Cited

U.S. PATENT DOCUMENTS

2018/0331877 A1* 11/2018 Epifano .................. H04B 1/06

FOREIGN PATENT DOCUMENTS

| JP | 2013-93694 A | 5/2013 |
|---|---|---|
| WO | WO 2011/071142 A1 | 6/2011 |

OTHER PUBLICATIONS

"Structure of high-speed A-D conversion and IC application technique (latter part)", Yokogawa Test & Measurement Corporation, [Retrieved on Dec. 27, 2018], Internet (URL: https://www.yokogawa.com/jp-ymi/tm/TI/keimame/ad1/ad1_6.htm), Total 3 pages.
Sugimoto et al., "Resolution improvement by parallel Connection of ADCs", Technical Meeting of Society of Electronics, Information and Systems of the Institute of Electrical Engineers of Japan in 2013, pp. 1761-1762.

* cited by examiner

RECEIVER DEVICE AND RECEPTION METHOD

CROSS REFERENCE TO RELATED APPLICATIONS

This application is a Continuation of PCT International Application No. PCT/JP2019/008422, filed on Mar. 4, 2019, which is hereby expressly incorporated by reference into the present application.

TECHNICAL FIELD

The present invention relates to a receiver device and a reception method involving analog-to-digital (A/D) conversion processing.

BACKGROUND ART

In communication such as wireless communication and optical fiber communication, high-frequency signals having a frequency equal to or higher than 10 GHz have been increasingly handled in recent years. While communication in a wider band and more precise communication are required, reduction in voltage of a power supply for semiconductor integrated circuits is in progress as technology is developing in a semiconductor manufacturing process. As a result, it is urgent to achieve a low-voltage operation of an A/D converter configured to convert an analog signal to a digital signal.

In the communication such as the wireless communication and the optical fiber communication, digitization is in progress, and the A/D converter is thus a key device in a communication system. However, as the band of the signal becomes wider, a required sampling rate also increases. For example, when a signal at 10 GHz is handled, sampling performance per second corresponding to 20 GS/s or higher is required. In general, when the sampling rate increases, a bit resolution tends to decrease conversely. For example, in an A/D converter having a sampling rate of 100 MS/s, a bit resolution of approximately 16 bits can be achieved. However, in an A/D converter having a sampling rate of 20 GS/s, the bit resolution decreases to about several bits. "S/s" is a unit of the sampling rate, and stands for "Samples per second".

As a related-art method for improving the bit resolution of an A/D converter, there are an input voltage sharing method described in Non-Patent Literature 1 or Non-Patent Literature 2 and a sub-ranging method described in Patent Literature 1. In the input voltage sharing method, an analog input voltage range is shared among M A/D converters each having N bits of quantization bits, and $N+\log_2(M)$ bits are consequently obtained as quantization bits. Meanwhile, in the sub-ranging method, additional devices such as a D/A converter, a subtraction circuit, and an amplifier are used in addition to two A/D converters, and the maximum of 2N bits can consequently be obtained as the quantization bits.

CITATION LIST

Patent Literature

[PTL 1] JP 4681622 B2
[PTL 2] JP 2013-93694 A

Non Patent Literature

[NPL 1] "Structure of high-speed A-D conversion and IC application technique (latter part)", Yokogawa Test & Measurement Corporation, [Retrieved on Dec. 27, 2018], Internet (URL: https://www.yokogawa.com/jp-ymi/tm/TI/keimame/ad1/ad1_6.htm).

[NPL 2] Sugimoto, Toshiki and two others, "Resolution improvement by parallel connection of ADCs", Technical Meeting of Society of Electronics, Information and Systems of the Institute of Electrical Engineers of Japan in 2013, pp. 1761-1762.

SUMMARY OF INVENTION

Technical Problem

The input voltage sharing method described in Non-Patent Literature 1 or Non-Patent Literature 2 is a method of improving the bit resolution through use of a plurality of N-bit A/D converters. However, each time the bit resolution is increased by one bit, the number of required A/D converters is doubled. For example, in order to improve the bit resolution by four bits, $2^4=16$ A/D converters are required, which is not practical from the viewpoint of circuit implementation.

Meanwhile, in the case of the sub-ranging method described in Patent Literature 1, it is possible to double the bit resolution through use of the two A/D converters. However, in this case, the D/A converter having a high conversion precision is required. Further, as the band of the signal becomes wider, increases in performance of analog characteristics of the subtraction circuit and the amplifier are required. In particular, when a wide-band signal at 20 GS/s level is handled, a D/A converter having such a high conversion precision does not exist.

Further, for example, due to the influence of noise occurring in the subtraction circuit and the amplifier and high-frequency signal characteristics, an effect of improving the bit resolution is not provided. As described above, not only the additional devices such as the D/A converter, the subtraction circuit, and the amplifier are required, but also the effect of improving the bit resolution may not be provided due to the influence of the noise or the high-frequency signal characteristics of the added devices.

The present invention has been made in order to solve the above-mentioned problems, and has an object to provide a receiver device and a reception method which are capable of improving a bit resolution while suppressing an increase in the number of A/D converters.

Solution to Problem

According to one embodiment of the present invention, there is provided a receiver device including: a plurality of A/D converters which include a first A/D converter and a second A/D converter, and are each configured to convert a reception signal formed of an analog signal to a digital signal; an amplifier which is provided at a previous stage of the second A/D converter; and a digital signal processing unit configured to process the digital signal output from the first A/D converter and the digital signal output from the second A/D converter, wherein the reception signal is directly input to the first A/D converter, wherein the reception signal having been amplified by the amplifier is input to the second A/D converter, and wherein the digital signal processing unit includes: an amplitude comparison unit configured to compare an amplitude of the digital signal output from the first A/D converter and an amplitude of the digital signal output from the second A/D converter to make a determination, and to output a determination result; and a selector configured to select and output one of the digital signal output from the first A/D converter or the digital signal output from the second A/D converter based on the determination result.

Advantageous Effects of Invention

According to the receiver device of the present invention, it is possible to improve the bit resolution while suppressing the increase in the number of the A/D converters.

DESCRIPTION OF EMBODIMENTS

Referring to the accompanying drawings, a receiver device and a reception method according to embodiments of the present invention are now described.

First Embodiment

Figure 1:
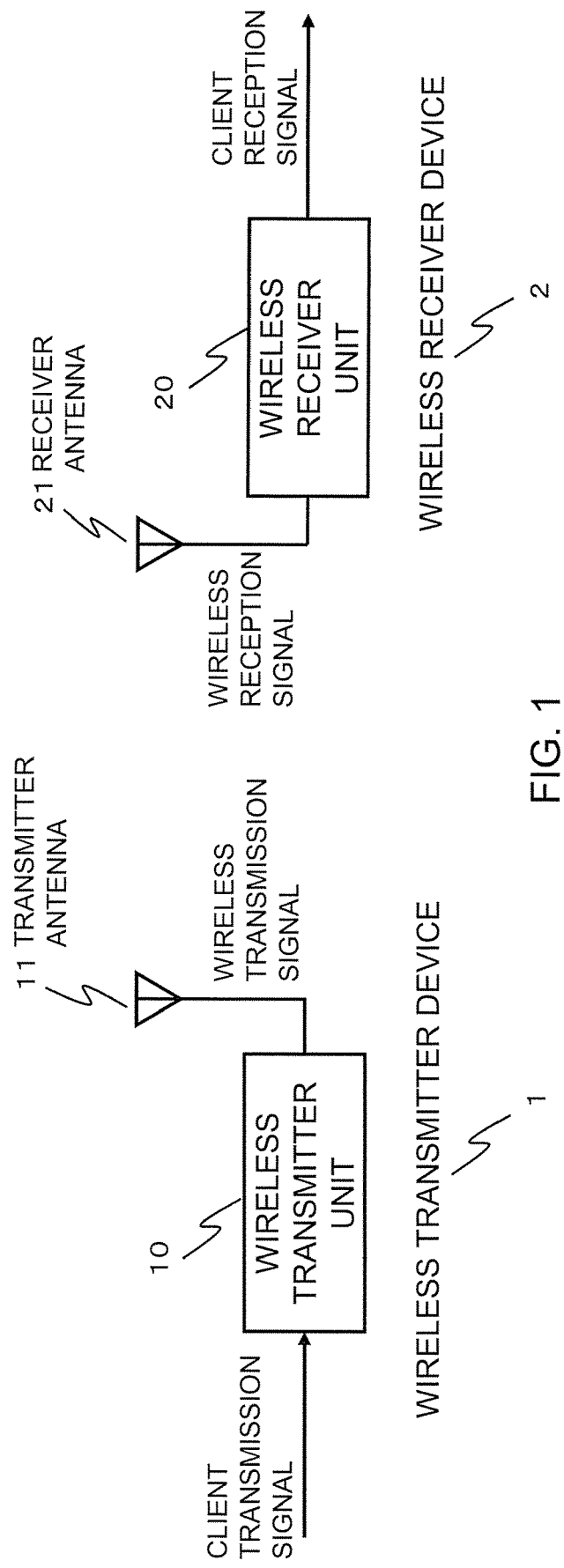
FIG. 1 is a diagram for illustrating a configuration of a wireless communication system provided with a receiver device according to a first embodiment of the present invention.

FIG. 1 is a configuration diagram for illustrating a configuration of a wireless communication system provided with a receiver device according to a first embodiment of the present invention. In FIG. 1, a wireless receiver device is exemplified as the receiver device. As illustrated in FIG. 1, the wireless communication system includes a wireless transmitter device 1 and a wireless receiver device 2. The wireless transmitter device 1 is configured to transmit a wireless transmission signal. The wireless receiver device 2 is configured to receive a wireless transmission signal. The wireless transmitter device 1 includes a wireless transmitter unit 10 and a transmitter antenna 11. The wireless transmitter unit 10 is configured to generate a wireless transmission signal from a client transmission signal. The transmitter antenna 11 is configured to transmit the wireless transmission signal. The wireless receiver device 2 includes a receiver antenna 21 and a wireless receiver unit 20. The receiver antenna 21 is configured to receive a wireless transmission signal. The wireless receiver unit 20 is configured to generate a client reception signal from the wireless reception signal received by the receiver antenna.

Figure 2:
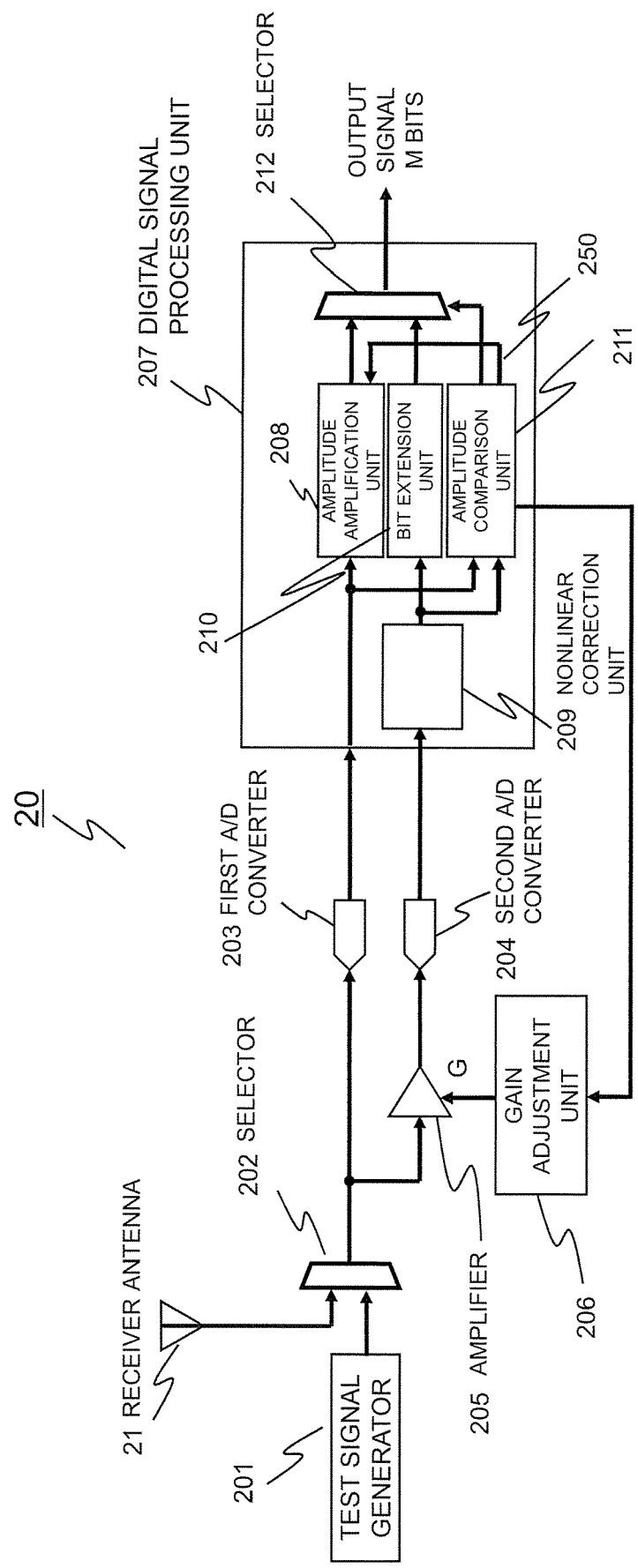
FIG. 2 is a diagram for illustrating a configuration of the receiver device according to the first embodiment of the present invention.

FIG. 2 is a configuration diagram for illustrating a configuration of the wireless receiver device 2 of FIG. 1. In FIG. 2, description is given of, as an example, a case in which two A/D converters are provided.

As described above, the wireless receiver device 2 is formed of the receiver antenna 21 configured to receive the signal and the wireless receiver unit 20. As illustrated in FIG. 2, the wireless receiver unit 20 includes a test signal generator 201, a selector 202, a first A/D converter 203, a second A/D converter 204, an amplifier 205, a gain adjustment unit 206, and a digital signal processing unit 207.

The test signal generator 201 is configured to generate a test signal. The test signal is a signal used to adjust reference voltages for the first A/D converter 203 and the second A/D converter 204, and to adjust time skew occurring due to a difference in length between two signal lines. The test signal is output from the test signal generator 201 usually before the reception of the reception signal starts. Moreover, correction can also be made through use of the test signal during the operation after the start of the reception. A method for the correction is proposed in, for example, Patent Literature 2. Specifically, the correction is made in such a manner that a signal having a known amplitude and pulse width is generated, whether or not an M-bit signal output from the digital signal processing unit 207 is output as defined is determined, and the gain adjustment unit 206 and an amplitude amplification unit 208 described below are adjusted based on the determination.

The selector 202 is configured to select and output one of the reception signal received by the receiver antenna 21 or the test signal generated by the test signal generator 201. When the test signal generator 201 outputs the test signal before the receiver antenna 21 starts the reception of the reception signal, the selector 202 selects and outputs the test signal. Meanwhile, during the operation after the receiver antenna 21 starts the reception, the selector 202 selects and outputs the reception signal received by the receiver antenna. However, when a signal for instructing the correction using the test signal is input from the outside, the selector 202 selects and outputs the test signal in accordance with the signal input from the outside.

The first A/D converter 203 is configured to convert the analog signal output from the selector 202 to a digital signal.

The amplifier 205 is configured to amplify the analog signal output from the selector 202.

The gain adjustment unit 206 is configured to adjust a gain G of the amplifier 205. A gain adjustment signal is input from the digital signal processing unit 207 to the gain adjustment unit 206. The gain adjustment unit 206 adjusts the value of the gain G based on the gain adjustment signal, and outputs the adjusted value to the amplifier 205.

The second A/D converter 204 is configured to convert the analog signal amplified by the amplifier 205 to a digital signal.

The digital signal processing unit 207 is configured to process the digital signal output from each of the first A/D converter 203 and the second A/D converter 204. The digital signal processing unit 207 includes the amplitude amplification unit 208, a nonlinear correction unit 209, a bit extension unit 210, an amplitude comparison unit 211, and a selector 212.

The amplitude amplification unit 208 is configured to multiply the amplitude of the digital signal output from the first A/D converter 203. The amplitude amplification unit 208 amplifies the amplitude of the digital signal output from the first A/D converter 203 in accordance with a control signal 250 output based on an amplitude comparison result obtained by the amplitude comparison unit 211 so that a gain equivalent to the amplification by the amplifier 205 is obtained.

The digital signal output from the second A/D converter 204 is input to the nonlinear correction unit 209. When an input/output amplitude characteristic of the amplifier 205 has nonlinearity, the nonlinear correction unit 209 applies, to the digital signal output from the second A/D converter 204, processing of converting the characteristic so as to be linear. The nonlinear correction unit 209 stores a nonlinear correction table in a memory in advance, and uses the nonlinear correction table to make the correction. The nonlinear correction table stores data on the amplitude characteristic of the amplifier 205 measured in advance and data after the correction obtained by converting the data on the amplitude characteristic so as to be linear while the data and the corrected data are associated with each other. The nonlinear correction unit 209 uses the data of the nonlinear correction table stored in the memory to correct the digital signal output from the second A/D converter 204.

The bit extension unit 210 is provided between the nonlinear correction unit 209 and the selector 212. The bit extension unit 210 is configured to execute bit extension processing of filling "0"s in upper bits of the digital signal output from the nonlinear correction unit 209. Specifically, when the digital signal output from the nonlinear correction unit 209 is, for example, $(b'_5 b'_6 b'_7 b'_8)$, and processing of filling "0"s in upper four bits is executed, the output signal from the bit extension unit 210 becomes a digital signal $(0000 b'_5 b'_6 b'_7 b'_8)$.

The amplitude comparison unit 211 is configured to compare the amplitude of the digital signal output from the first A/D converter 203 and the amplitude of the digital signal output from the second A/D converter 204 to make a determination, and to output a determination result. In the first embodiment, the amplitude comparison unit 211 executes, for example, the following processing. The amplitude comparison unit 211 compares the digital signal output from the first A/D converter 203 and a first amplitude threshold value set in advance with each other. The amplitude comparison unit 211 outputs "1" as the determination result when the digital signal is smaller than the first amplitude threshold value, and outputs "0" as the determination result when the digital signal is equal to or larger than the first amplitude threshold value. The determination result obtained by the comparison with the first amplitude threshold value is hereinafter referred to as "first determination result". Moreover, the amplitude comparison unit 211 compares the amplitude of the digital signal output from the second A/D converter 204 and a second amplitude threshold value set in advance with each other. The amplitude comparison unit 211 outputs "1" as the determination result when the digital signal is smaller than the second amplitude threshold value. The amplitude comparison unit 211 outputs "0" as the determination result when the digital signal is equal to or larger than the second amplitude threshold value. The determination result obtained by the comparison with the second amplitude threshold value is hereinafter referred to as "second determination result". As a result, as long as the amplitude of the signal input to the A/D converter is within the ranges set based on the first amplitude threshold value and the second amplitude threshold value, the output signal from the relevant A/D converter can be validated.

The selector 212 is configured to select one of the digital signal output from the first A/D converter 203 or the digital signal output from the second A/D converter 204 based on the first determination result and the second determination result of the amplitude comparison unit 211. Specifically, the selector 212 selects the digital signal output from the first A/D converter 203 when the first determination result is "1", and the selector 212 selects the digital signal output from the second A/D converter 204 when the second determination result is "1". As described above, the selector 212 selects and outputs the digital signal determined to be valid by the amplitude comparison unit 211.

Description is now given of an operation of the wireless receiver device 2 according to the first embodiment.

The wireless reception signal received by the receiver antenna 21 is input to the selector 202. The selector 202 selects one of the reception signal or the test signal, and outputs the selected signal. The signal selected by the selector 202 is branched. One part of the signal is input to the first A/D converter 203. The other part of the signal is input to the second A/D converter 204 through the amplifier 205.

Figure 3:
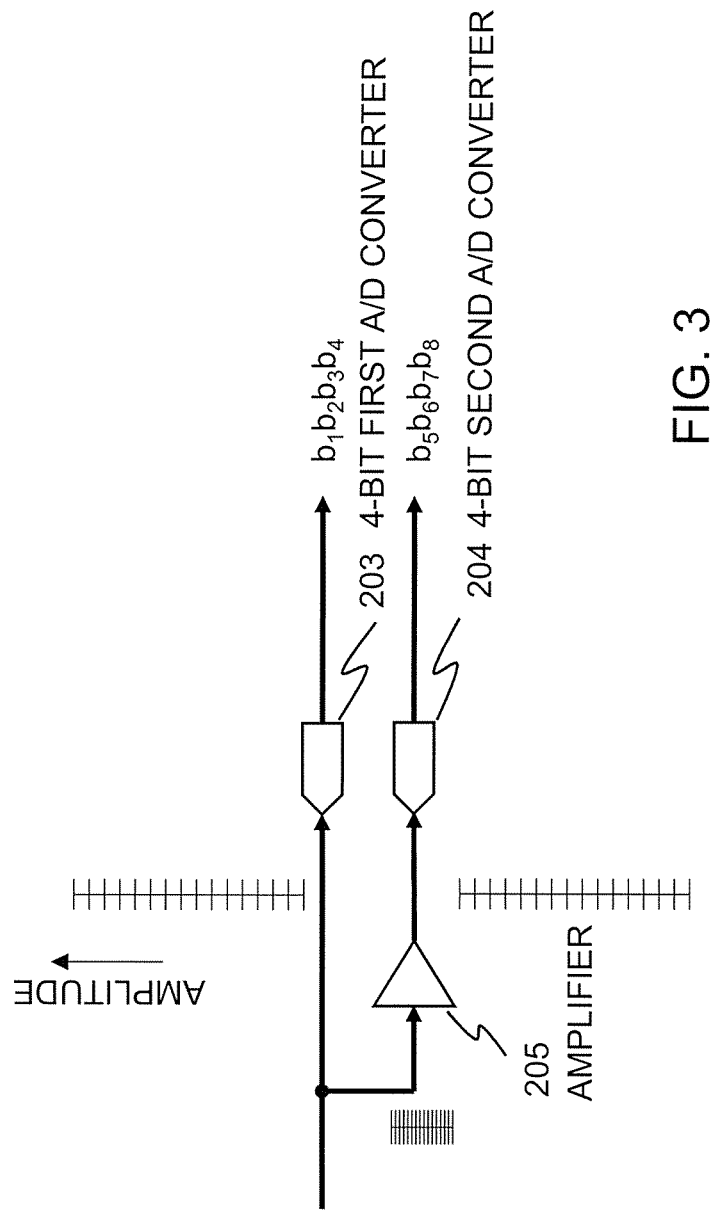
FIG. 3 is a diagram for illustrating operations of two 4-bit A/D converters and an amplifier provided in the receiver device according to the first embodiment of the present invention.

FIG. 3 is a diagram for illustrating the digital signals output by the first A/D converter 203 and the second A/D converter 204, respectively. In FIG. 3, A/D converters having four bits as quantization bits are illustrated as examples of the first A/D converter 203 and the second A/D converter 204. The signal output from the selector 202 is directly input to the first A/D converter 203, and the first A/D converter 203 outputs a digital signal $(b_1 b_2 b_3 b_4)$ at 16 levels corresponding to the amplitude of the signal, that is, in four bits. Meanwhile, the second A/D converter 204 includes the amplifier 205 at a previous stage thereof. Therefore, in the case of the second A/D converter 204, the signal output from the selector 202 is first amplified by the amplifier 205, and the amplified signal is input to the second A/D converter 204. As illustrated in FIG. 3, in the first embodiment, the input signal is branched into the two portions. Then, the one portion is input to the first A/D converter 203, and the other portion is input to the amplifier 205. Under this state, the amplifier 205 adjusts the amplitude of the amplified signal so as to be equivalent to the amplitude of the signal output from the amplitude amplification unit 208 of the digital signal processing unit through the first A/D converter 203. That is, the second A/D converter 204 identifies a signal at 16 levels having a small maximum amplitude as compared to a signal at a previous stage of the amplifier 205. A digital signal $(b_5 b_6 b_7 b_8)$ at 16 levels, that is, in four bits, is output from the second A/D converter 204.

The digital signals output from the first A/D converter 203 and the second A/D converter 204 are each input to the digital signal processing unit 207.

The digital signal $(b_5 b_6 b_7 b_8)$ output from the second A/D converter 204 is input to the nonlinear correction unit 209. The nonlinear correction unit 209 uses the nonlinear correction table to apply the processing to the digital signal $(b_5 b_6 b_7 b_8)$, and the processing converts the nonlinearity of the input/output amplitude characteristic of the amplifier 205 so as to be linear. The digital signal $(b'_5 b'_6 b'_7 b'_8)$ is output from the nonlinear correction unit 209.

Figure 4:
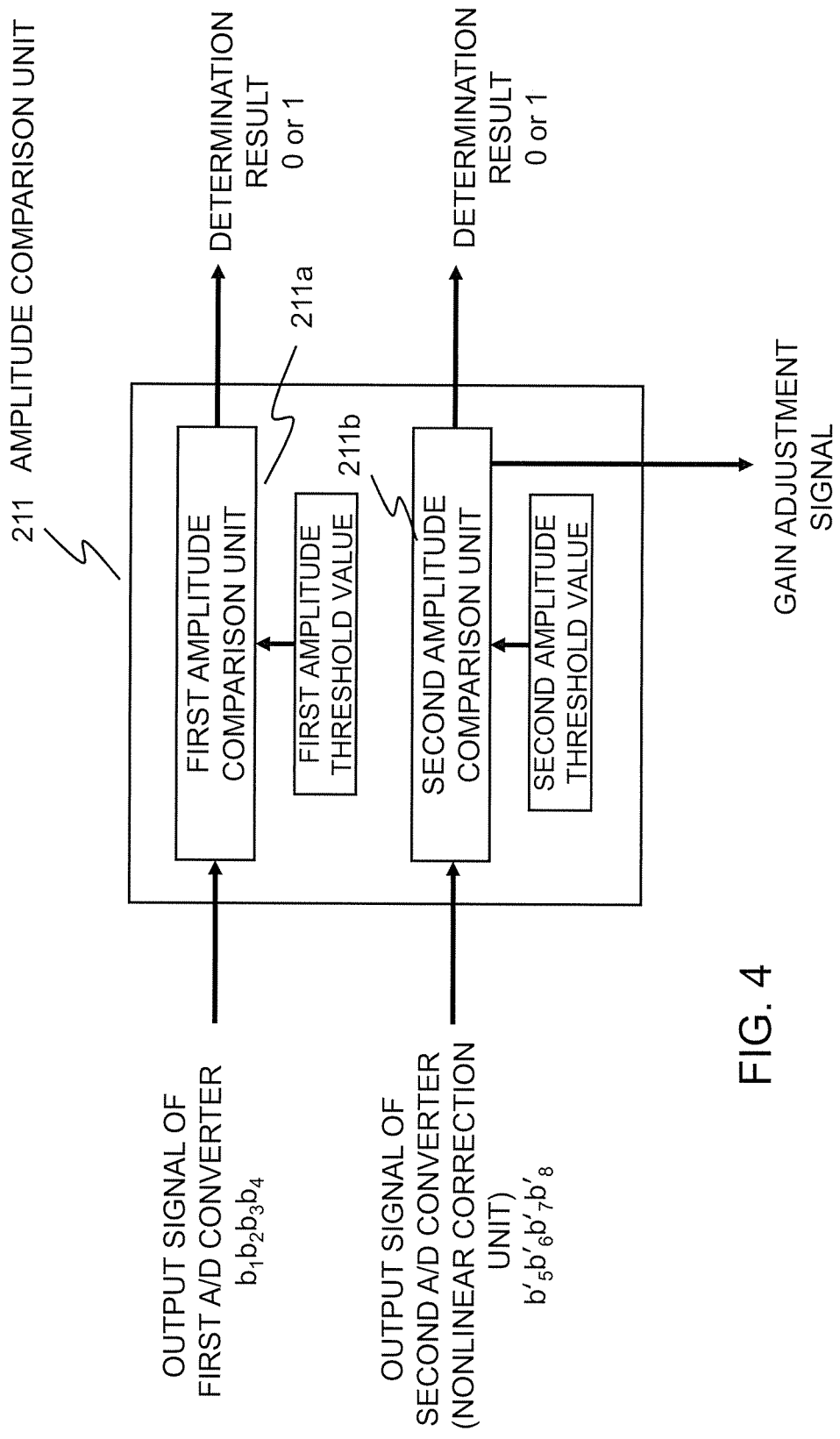
FIG. 4 is a diagram for illustrating a configuration of an amplitude comparison unit provided in the receiver device according to the first embodiment of the present invention.

FIG. 4 is a configuration diagram for illustrating details of the amplitude comparison unit 211. The digital signal $(b_1 b_2 b_3 b_4)$ output from the first A/D converter 203 and the digital signal $(b'_5 b'_6 b'_7 b'_8)$ output from the nonlinear correction unit 209 are input to the amplitude comparison unit 211. The amplitude comparison unit 211 includes a first amplitude comparison unit 211a and a second amplitude comparison unit 211b. Moreover, in the amplitude comparison unit 211, the first amplitude threshold value provided for the first A/D converter 203 and the second amplitude threshold value provided for the second A/D converter 204 are set in advance. The first amplitude comparison unit 211a is configured to compare the digital signal ($b_1b_2b_3b_4$) output from the first A/D converter 203 and the first amplitude threshold value with each other, and to output a determination result. The second amplitude comparison unit 211b is configured to compare the digital signal ($b'_5b'_6b'_7b'_8$) output from the nonlinear correction unit 209 and the second amplitude threshold value with each other, and to output a determination result.

As a result of the comparisons, when the digital signal ($b_1b_2b_3b_4$) is smaller than the first amplitude threshold value, the digital signal ($b_1b_2b_3b_4$) is selected by the selector 212 at the subsequent stage. When the digital signal ($b'_5b'_6b'_7b'_8$) is smaller than the second amplitude threshold value, the digital signal ($b'_5b'_6b'_7b'_8$) is selected by the selector 212 at the subsequent stage. Thus, in this configuration, each of the first amplitude threshold value and the second amplitude threshold value is appropriately set so that both of the digital signal ($b_1b_2b_3b_4$) and the digital signal ($b'_5b'_6b'_7b'_8$) are not selected at the same time. That is, the first A/D converter 203 is only required to identify a signal having a large amplitude when the signal is input to the receiver antenna 21, and it is thus only required to set the first amplitude threshold value so as to be equal to or larger than an amplitude corresponding to a valid number of bits of the A/D converter. Moreover, the second A/D converter 204 is only required to identify a signal having a small amplitude, and it is thus only required to set the second amplitude threshold value so that the signal output from the amplifier 205 does not remain at a "High" side of the second A/D converter 204.

The amplitude comparison unit 211 outputs the two determination results obtained by the first amplitude comparison unit 211a and the second amplitude comparison unit 211b as the first determination result and the second determination result, respectively. Moreover, when, in the second amplitude comparison unit 211b, the digital signal ($b'_5b'_6b'_7b'_8$), which is the input signal to the second amplitude comparison unit 211b, is not appropriate, and a state in which one of the determination results is "0" and the other one thereof is "1" is not thus brought about in the determination result of the first amplitude comparison unit 211a and the determination result of the second amplitude comparison unit 211b even by setting the first amplitude threshold value and the second amplitude threshold value to any values, the gain adjustment signal is output to the gain adjustment unit 206. The gain adjustment unit 206 adjusts the gain G of the amplifier 205 based on the gain adjustment signal.

Figure 5:
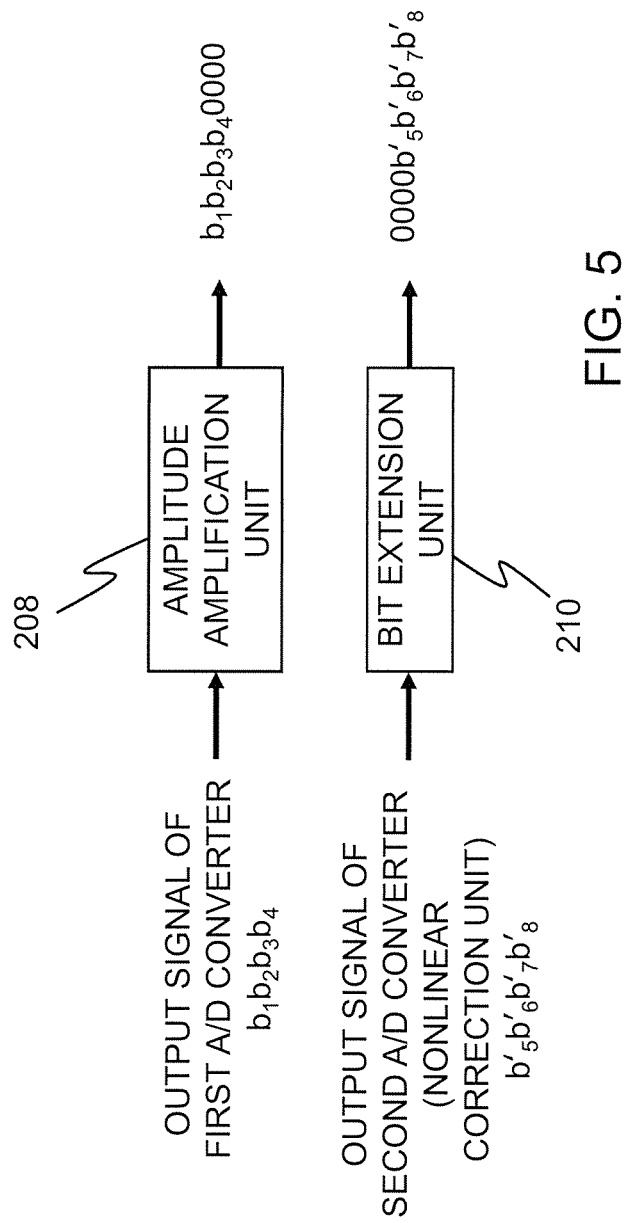
FIG. 5 is a diagram for illustrating operations of an amplitude amplification unit and a bit extension unit provided in the receiver device according to the first embodiment of the present invention.

FIG. 5 is a diagram for illustrating configurations of the amplitude amplification unit 208 and the bit extension unit 210 of the digital signal processing unit 207. The digital signal ($b_5b_6b_7b_8$) output from the second A/D converter 204 has been amplified by the gain G [dB] of the amplifier 205, and it is thus required to also amplify the digital signal ($b_1b_2b_3b_4$) from the first A/D converter 203 by an equivalent gain. Thus, the amplitude amplification unit 208 multiplies the amplitude of the digital signal ($b_1b_2b_3b_4$) output from the first A/D converter 203. As a result, the amplitude of the digital signal output from the first A/D converter 203 and the amplitude of the digital signal output from the second A/D converter 204 can similarly be treated. For example, when the gain G of the amplifier 205 is 24 dB, equivalent processing is achieved by multiplying the voltage amplitude by 16, that is, shifting by four bits. Thus, the amplitude amplification unit 208 executes, as the processing of multiplying the amplitude of the digital signal ($b_1b_2b_3b_4$) output from the first A/D converter 203 by 16, processing of filling "0"s in the lower four bits. Thus, the output signal output from the amplitude amplification unit 208 becomes a digital signal ($b_1b_2b_3b_40000$).

Moreover, the bit extension unit 210 applies processing of filling "0"s in the upper four bits to the digital signal ($b'_5b'_6b'_7b'_8$) output from the nonlinear correction unit 209. Thus, the output signal output from the bit extension unit 210 becomes a digital signal ($0000b'_5b'_6b'_7b'_8$).

As a result, both of the digital signal ($b_1b_2b_3b_40000$) output from the amplitude amplification unit 208 and the digital signal ($0000b'_5b'_6b'_7b'_8$) output from the bit extension unit 210 become 8-bit digital signals.

In the first embodiment, description has been given of the case in which the number of A/D converters is two, but the number of A/D converters may be three or more. In such a case, the gain G of an amplifier which inputs a signal to each A/D converter is set to a value corresponding to the amplifier.

As described above, the receiver device according to the first embodiment uses the plurality of A/D converters. Moreover, the reception signal is directly input to the first A/D converter 203, which is the one of the plurality of A/D converters, to convert the analog signal to the digital signal, and after that, the amplitude is amplified by the digital signal processing unit 207. Moreover, the signal amplified in the analog form by the amplifier 205 is input to the second A/D converter 204, which is the other A/D converter, to convert the amplified signal to the digital signal, and after that, the bit extension is applied to the digital signal by the digital signal processing unit 207. The amplitudes of the two or more reception signals obtained as described above are compared by the digital signal processing unit 207, to thereby select one output signal out of the output signals of the plurality of A/D converters.

With the receiver device according to the first embodiment, when M A/D converters having an N-bit resolution are used, an A/D converter having digital-signal output in the maximum of N×M bits can be achieved through a simple configuration. The first embodiment has a feature that a D/A converter having a highly precise bit resolution, which is required in the sub-ranging method, is not required, and an analog subtraction circuit operating for a high band signal is not required.

Moreover, in the first embodiment, the amplitude range of the input signal to be processed by one A/D converter is determined, and a bit resolution of N×M bits is not thus provided, but there can be provided a dynamic range equivalent to an A/D converter having the bit resolution of N×M bits. For example, the first embodiment is particularly effective in a wireless communication system and the like in which the input signal amplitude is not constant and a signal having a large amplitude and a small amplitude is thus input.

As described above, in the receiver device according to the first embodiment, the bit resolution can be improved while the increase in the number of A/D converters is suppressed.

Second Embodiment

Figure 6:
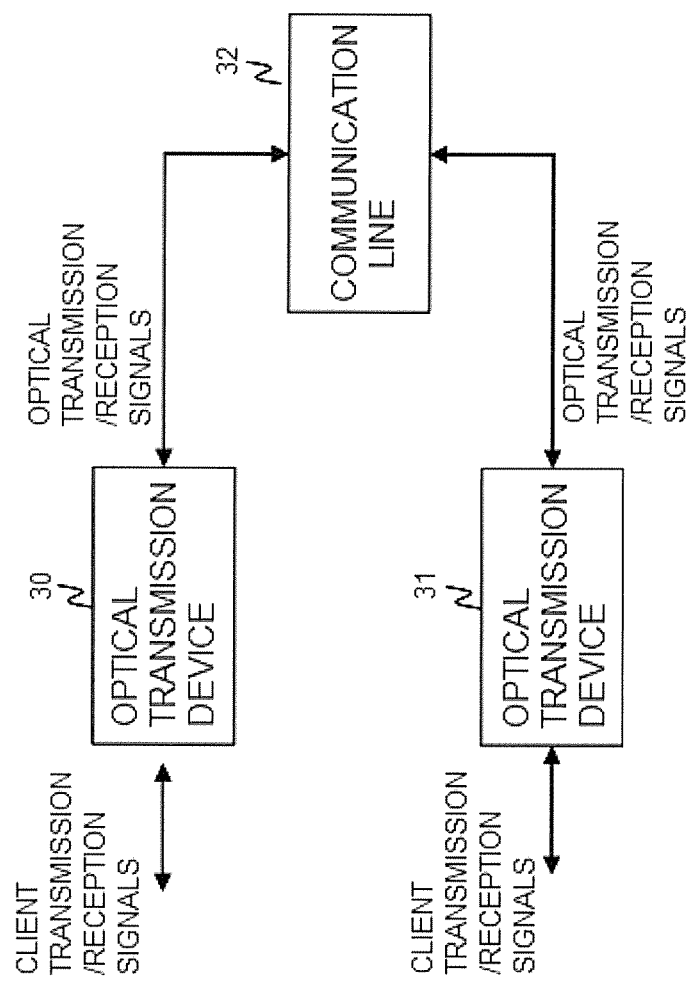
FIG. 6 is a diagram for illustrating a configuration of an optical communication system provided with a receiver device according to a second embodiment of the present invention.

FIG. 6 is a configuration diagram for illustrating a digital optical communication system provided with a receiver device according to a second embodiment of the present invention. The digital optical communication system is hereinafter simply referred to as "optical communication system". In FIG. 6, an optical transmission device is exemplified as the receiver device. The optical transmission device includes a receiver unit and a transmitter unit. The receiver unit functions as a receiver device. The transmitter unit functions as a transmitter device. As illustrated in FIG. 6, the digital optical communication system includes optical transmission devices 30 and 31 and a communication line 32. The optical transmission devices 30 and 31 are configured to transmit and receive optical signals. The communication line 32 connects the optical transmission device 30 and the optical transmission device 31 to each other. The communication line 32 is formed of an optical fiber. The transmitter unit of each of the optical transmission devices 30 and 31 is configured to generate an optical transmission signal from a client transmission signal, and transmit the optical transmission signal toward the other optical transmission device through the communication line 32. Moreover, the receiver unit of each of the optical transmission devices 30 and 31 is configured to receive an optical reception signal from the other optical transmission device through the communication line 32, and convert the optical reception signal to a client reception signal.

Figure 7:
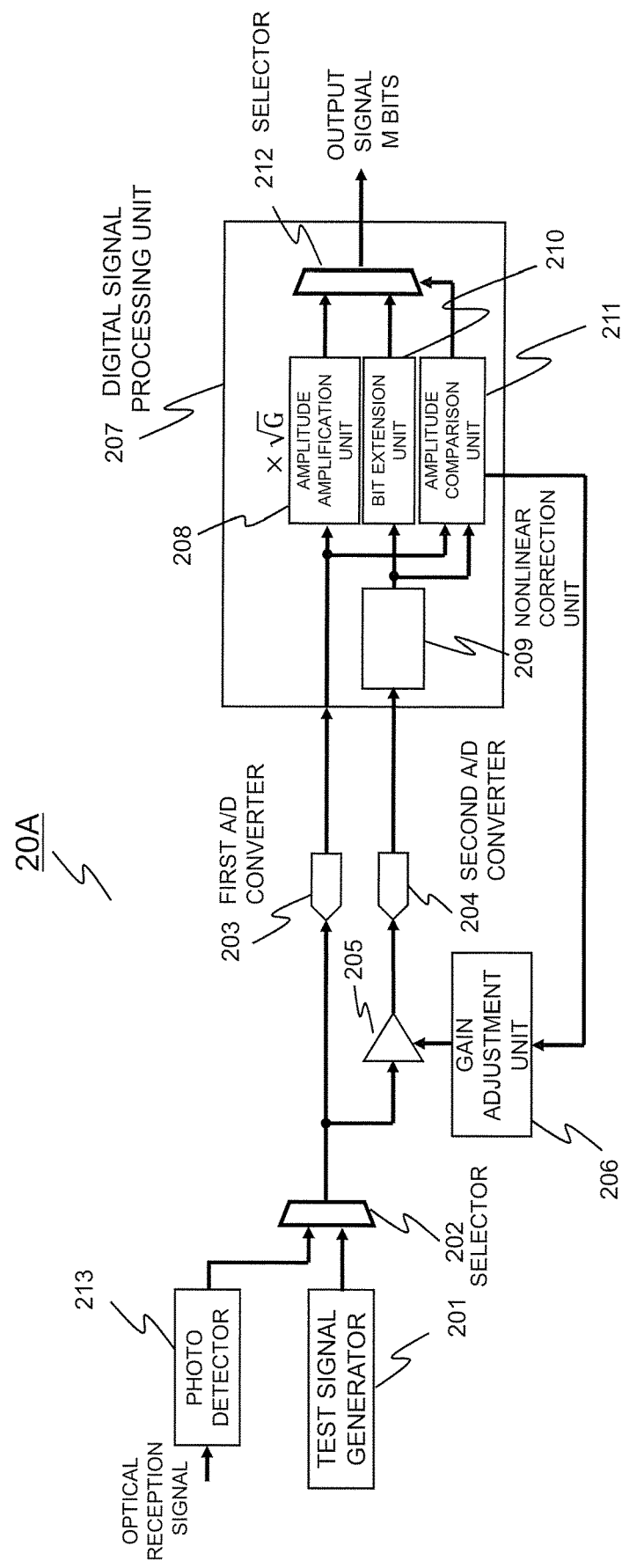
FIG. 7 is a diagram for illustrating a configuration of the receiver device according to the second embodiment of the present invention.

FIG. 7 is a configuration diagram for illustrating details of a receiver unit 20A of the optical transmission device of FIG. 6. In FIG. 7, description is given of, as an example, a case in which two A/D converters are provided. As illustrated in FIG. 7, the receiver unit 20A of the optical transmission device includes a photo detector 213, the test signal generator 201, the selector 202, the first A/D converter 203, the second A/D converter 204, the amplifier 205, the gain adjustment unit 206, and the digital signal processing unit 207. The photo detector 213 is configured to convert a received optical signal to an electrical signal. The test signal generator 201 is configured to generate the test signal. The selector 202 is configured to switch between the reception signal and the test signal. The amplifier 205 is configured to amplify the signal to be input to the second A/D converter 204. The gain adjustment unit 206 is configured to adjust the gain of the amplifier 205. The digital processing unit 207 is configured to process the digital signals output from the first A/D converter 203 and the second A/D converter 204.

The digital signal processing unit 207 includes the amplitude comparison unit 211, the amplitude amplification unit 208, the nonlinear correction unit 209, the bit extension unit 210, and the selector 212. The amplitude comparison unit 211 is configured to compare the amplitude of the digital signal output from the first A/D converter 203 and the amplitude of the digital signal output from the second A/D converter 204 with the amplitude threshold values. The amplitude amplification unit 208 is configured to multiply the amplitude of the digital signal output from the first A/D converter 203. When the gain characteristic of the amplifier 205 has nonlinearity, the nonlinear correction unit 209 converts the characteristic so as to be linear. The bit extension unit 210 is configured to fill "0"s in upper bits of the digital signal output from the nonlinear correction unit 209. The selector 212 is configured to select one of the digital signal outputs of the first A/D converter 203 and the second A/D converter 204 based on the determination result obtained by the amplitude comparison unit 211.

The second embodiment is different from the first embodiment in only a point that the photo detector 213 is provided in place of the receiver antenna 21 of the configuration of FIG. 2 described in the first embodiment. The other components are the same as those in the first embodiment, and are thus denoted by the same reference numerals.

In the reception unit 20A in the second embodiment, the optical reception signal received through the communication line 32 is first converted to the electrical signal by the photo detector 213. The electrical signal output from the photo detector 213 is input to the selector 202. The other operations are the same as those of the first embodiment, and description thereof is thus omitted herein.

In the second embodiment, description has been given of the case in which the number of A/D converters is two, but the number of A/D converters may be three or more. In such a case, the gain G of an amplifier which inputs a signal to each A/D converter is set to a value corresponding to the amplifier.

As described above, as in the first embodiment, the receiver device according to the second embodiment uses the plurality of A/D converters. Moreover, the reception signal is directly input to the first A/D converter 203, which is the one of the plurality of A/D converters, to convert the analog signal to the digital signal, and after that, the amplitude is amplified by the amplitude amplification unit 208 of the digital signal processing unit 207. Moreover, the signal amplified in the analog form by the amplifier 205 is input to the second A/D converter 204, which is the other A/D converter, to convert the amplified signal to the digital signal, and after that, the bit extension is applied to the digital signal by the bit extension unit 210 of the digital signal processing unit 207. The amplitudes of the two or more reception signals obtained as described above are compared by the amplitude comparison unit 211 of the digital signal processing unit 207, to thereby select one output signal out of the output signals of the plurality of A/D converters.

Thus, as in the first embodiment, also in the second embodiment, the bit resolution can be improved while the increase in the number of A/D converters is suppressed.

A brief description is now given of hardware configurations of the digital signal processing unit 207 and the gain adjustment unit 206 described in the first embodiment and the second embodiment.

Each of the functions of the digital signal processing unit 207 and the gain adjustment unit 206 in the receiver device of the first and second embodiments described above is implemented by a processing circuit. The processing circuit for implementing each of the functions may be dedicated hardware, or a processor configured to execute a program stored in a memory.

When the processing circuit is dedicated hardware, the processing circuit corresponds to, for example, a single circuit, a composite circuit, a programmed processor, a parallel-programmed processor, an application specific integrated circuit (ASIC), a field programmable gate array (FPGA), or a combination thereof. The components of the digital signal processing unit 207 and the functions of the gain adjustment unit 206 may each be implemented by an individual processing circuit, or may be implemented together by the processing circuit.

Meanwhile, when the processing circuit is the processor, the components of the digital signal processing unit 207 and the functions of the gain adjustment unit 206 are implemented by software, firmware, or a combination of software and firmware. The software and the firmware are coded as programs and stored in the memory. The processor reads out and executes the programs stored in the memory, to thereby implement the function of each of the components. That is, the receiver device includes a memory for storing a program to be executed by the processing circuit to consequently cause each step to be executed by each component of the digital signal processing unit 207 and the gain adjustment unit 206 to be executed.

It is also understood that those programs cause a computer to execute the steps and methods described above for the respective components. In this case, the memory corresponds to, for example, a random access memory (RAM), a read only memory (ROM), a flash memory, an erasable programmable read only memory (EPROM), an electrically erasable and programmable read only memory (EEPROM), or other such non-volatile or volatile semiconductor memory. The memory also corresponds to, for example, a magnetic disk, a flexible disk, an optical disc, a compact disc, a MiniDisk, or a DVD.

Some of the functions of the respective components described above may be implemented by dedicated hardware, and others thereof may be implemented by software or firmware.

In this manner, the processing circuit can implement the function of each of the components described above by hardware, software, firmware, or a combination thereof.

REFERENCE SIGNS LIST 1 wireless transmitter device, 2 wireless receiver device, 10 wireless transmitter unit, 11 transmitter antenna, 20 wireless receiver unit, 20A receiver unit, 21 receiver antenna, 30, 31 optical transmission device, 32 communication line, 201 test signal generator, 202 selector, 203 first A/D converter, 204 second A/D converter, 205 amplifier, 206 gain adjustment unit, 207 digital signal processing unit, 208 amplitude amplification unit, 209 nonlinear correction unit, 210 bit extension unit, 211 amplitude comparison unit, 211a first amplitude comparison unit, 211b second amplitude comparison unit, 212 selector, 213 photo detector

The invention claimed is:

1. A receiver device, comprising:
A/D converters which include a first A/D converter and a second A/D converter, and each of the first A/D converter and the second A/D converter is configured to convert a reception signal formed of an analog signal to a digital signal;
an amplifier which is provided at a previous stage of the second A/D converter; and
a digital signal processor configured to process the digital signal output from the first A/D converter and the digital signal output from the second A/D converter,
wherein the reception signal is directly input to the first A/D converter,
wherein the reception signal having been amplified by the amplifier is input to the second A/D converter, and
wherein the digital signal processor includes:
amplitude comparison circuitry configured to compare an amplitude of the digital signal output from the first A/D converter and an amplitude of the digital signal output from the second A/D converter to make a determination, and to output a determination result; and
a selector configured to select and output one of the digital signal output from the first A/D converter or the digital signal output from the second A/D converter based on the determination result.

2. The receiver device according to claim 1, wherein the amplitude comparison circuitry is configured to:
compare the amplitude of the digital signal output from the first A/D converter and a first amplitude threshold value set in advance with each other, and output a first determination result indicating that the digital signal output from the first A/D converter is valid when the amplitude of the digital signal output from the first A/D converter is smaller than the first amplitude threshold value; and
compare the amplitude of the digital signal output from the second A/D converter and a second amplitude threshold value set in advance with each other, and output a second determination result indicating that the digital signal output from the second A/D converter is valid when the amplitude of the digital signal output from the second A/D converter is smaller than the second amplitude threshold value, and
wherein the selector is configured to select and output, through use of the first determination result and the second determination result as the determination result, a digital signal which is determined to be valid out of the digital signal output from the first A/D converter and the digital signal output from the second A/D converter.

3. The receiver device according to claim 2,
wherein the digital signal processor further includes nonlinear correction circuitry configured to convert an amplitude characteristic of the amplifier so as to be linear through use of a nonlinear correction table when the amplitude characteristic is nonlinear, and
wherein the nonlinear correction table stores data on the amplitude characteristic of the amplifier measured in advance and data after the correction obtained by converting the data on the amplitude characteristic so as to be linear, in association with each other.

4. The receiver device according to claim 3, wherein the digital signal processor further includes bit extension circuitry which is provided between the nonlinear correction circuitry and the selector, and which is configured to execute bit extension processing of filling 0 in an upper bit of the digital signal which is output from the second A/D converter to be corrected by the nonlinear correction circuitry.

5. The receiver device according to claim 4, wherein the digital signal processor further includes amplitude amplification circuitry configured to amplify the amplitude of the digital signal output from the first A/D converter in order to provide a gain equivalent to the amplification by the amplifier, based on the determination result obtained by the amplitude comparison circuitry.

6. The receiver device according to claim 2, wherein the digital signal processor further includes amplitude amplification circuitry configured to amplify the amplitude of the digital signal output from the first A/D converter in order to provide a gain equivalent to the amplification by the amplifier, based on the determination result obtained by the amplitude comparison circuitry.

7. The receiver device according to claim 3, wherein the digital signal processor further includes amplitude amplification circuitry configured to amplify the amplitude of the digital signal output from the first A/D converter in order to provide a gain equivalent to the amplification by the amplifier, based on the determination result obtained by the amplitude comparison circuitry.

8. The receiver device according to claim 1,
wherein the digital signal processor further includes nonlinear correction circuitry configured to convert an amplitude characteristic of the amplifier so as to be linear through use of a nonlinear correction table when the amplitude characteristic is nonlinear, and wherein the nonlinear correction table stores data on the amplitude characteristic of the amplifier measured in advance and data after the correction obtained by converting the data on the amplitude characteristic so as to be linear, in association with each other.

9. The receiver device according to claim 8, wherein the digital signal processor further includes bit extension circuitry which is provided between the nonlinear correction circuitry and the selector, and which is configured to execute bit extension processing of filling 0 in an upper bit of the digital signal which is output from the second A/D converter to be corrected by the nonlinear correction circuitry.

10. The receiver device according to claim 9, wherein the digital signal processor further includes amplitude amplification circuitry configured to amplify the amplitude of the digital signal output from the first A/D converter in order to provide a gain equivalent to the amplification by the amplifier, based on the determination result obtained by the amplitude comparison circuitry.

11. The receiver device according to claim 8, wherein the digital signal processor further includes amplitude amplification circuitry configured to amplify the amplitude of the digital signal output from the first A/D converter in order to provide a gain equivalent to the amplification by the amplifier, based on the determination result obtained by the amplitude comparison circuitry.

12. The receiver device according to claim 1, wherein the digital signal processor further includes amplitude amplification circuitry configured to amplify the amplitude of the digital signal output from the first A/D converter in order to provide a gain equivalent to the amplification by the amplifier, based on the determination result obtained by the amplitude comparison circuitry.

13. A reception method, comprising the steps of:
directly inputting a reception signal formed of an analog signal to a first A/D converter of a plurality of A/D converters to convert the reception signal to a digital signal;

amplifying the reception signal;

inputting the amplified reception signal to a second A/D converter of the plurality of A/D converters to convert the amplified reception signal to a digital signal;

comparing an amplitude of the digital signal output from the first A/D converter and an amplitude of the digital signal output from the second A/D converter to make a determination, and outputting a determination result; and selecting and outputting one of the digital signal output from the first A/D converter or the digital signal output from the second A/D converter based on the determination result.

* * * * *